United States Patent
Chiu et al.

(10) Patent No.: US 12,485,664 B2
(45) Date of Patent: Dec. 2, 2025

(54) LAMINATION APPARATUS AND METHOD

(71) Applicant: Taiwan Semiconductor Manufacturing Company, Ltd., Hsinchu (TW)

(72) Inventors: Yu-Ting Chiu, Hsinchu County (TW); Ying-Jui Huang, Hsinchu County (TW); Chien-Ling Hwang, Hsinchu (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 156 days.

(21) Appl. No.: 18/165,933

(22) Filed: Feb. 8, 2023

(65) Prior Publication Data
US 2024/0262096 A1  Aug. 8, 2024

(51) Int. Cl.
| B29C 65/00 | (2006.01) |
| B32B 37/18 | (2006.01) |
| B29C 65/02 | (2006.01) |
| B29C 65/20 | (2006.01) |
| B29C 65/70 | (2006.01) |
| B29C 65/78 | (2006.01) |
| H01L 21/48 | (2006.01) |
| H01L 21/56 | (2006.01) |

(Continued)

(52) U.S. Cl.
CPC .............. *B32B 37/18* (2013.01); *B29C 65/02* (2013.01); *B29C 65/2076* (2013.01); *B29C 65/70* (2013.01); *B29C 65/7847* (2013.01); *B29C 66/00145* (2013.01); *B29C 66/472* (2013.01); *B32B 2307/204* (2013.01); *B32B 2307/538* (2013.01); *B32B 2307/732* (2013.01); *B32B 2309/02* (2013.01); *B32B 2309/68* (2013.01); *B32B 2319/00* (2013.01); *B32B 2457/14* (2013.01); *H01L 21/4853* (2013.01); *H01L 21/568* (2013.01); *H01L 24/19* (2013.01); *H01L 24/83* (2013.01); *H01L 25/50* (2013.01); *H01L 2224/19* (2013.01); *H01L 2224/8385* (2013.01)

(58) Field of Classification Search
CPC ..... B29C 65/02; B29C 65/2076; B29C 65/70; B29C 65/7847; B29C 66/00145; B29C 66/472
See application file for complete search history.

(56) References Cited

U.S. PATENT DOCUMENTS

2014/0053974 A1*  2/2014  Hirose ................ B32B 37/1009
156/538

FOREIGN PATENT DOCUMENTS

| TW | 201506117 | 2/2015 |
| TW | 201533831 | 9/2015 |

OTHER PUBLICATIONS

TW 2015/33831A spec translation (Year: 2015).*
"Office Action of Taiwan Counterpart Application", issued on Jun. 11, 2024, p. 1-p. 6.

* cited by examiner

Primary Examiner — Philip C Tucker
Assistant Examiner — Nickolas R Harm
(74) Attorney, Agent, or Firm — JCIPRNET

(57) ABSTRACT

A method for laminating a film to a wafer and apparatus for performing the lamination process are disclosed. The method includes providing the wafer and the film in a process chamber where the wafer and the film are separated from each other, achieving a vacuum state and a process temperature in the process chamber, and laminating the film to contact a surface of the wafer.

20 Claims, 16 Drawing Sheets

(51) Int. Cl.
*H01L 23/00* (2006.01)
*H01L 25/00* (2006.01)

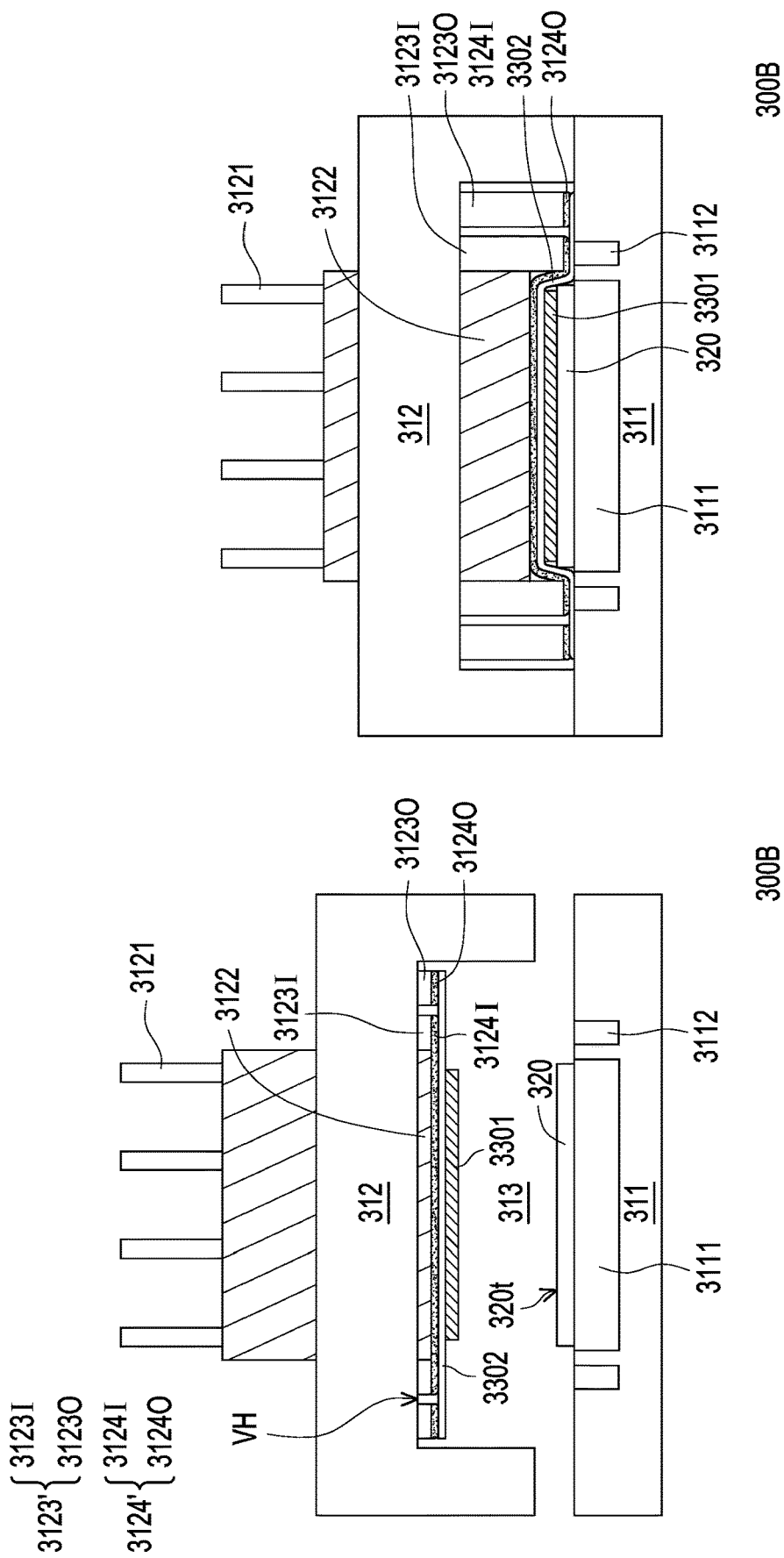

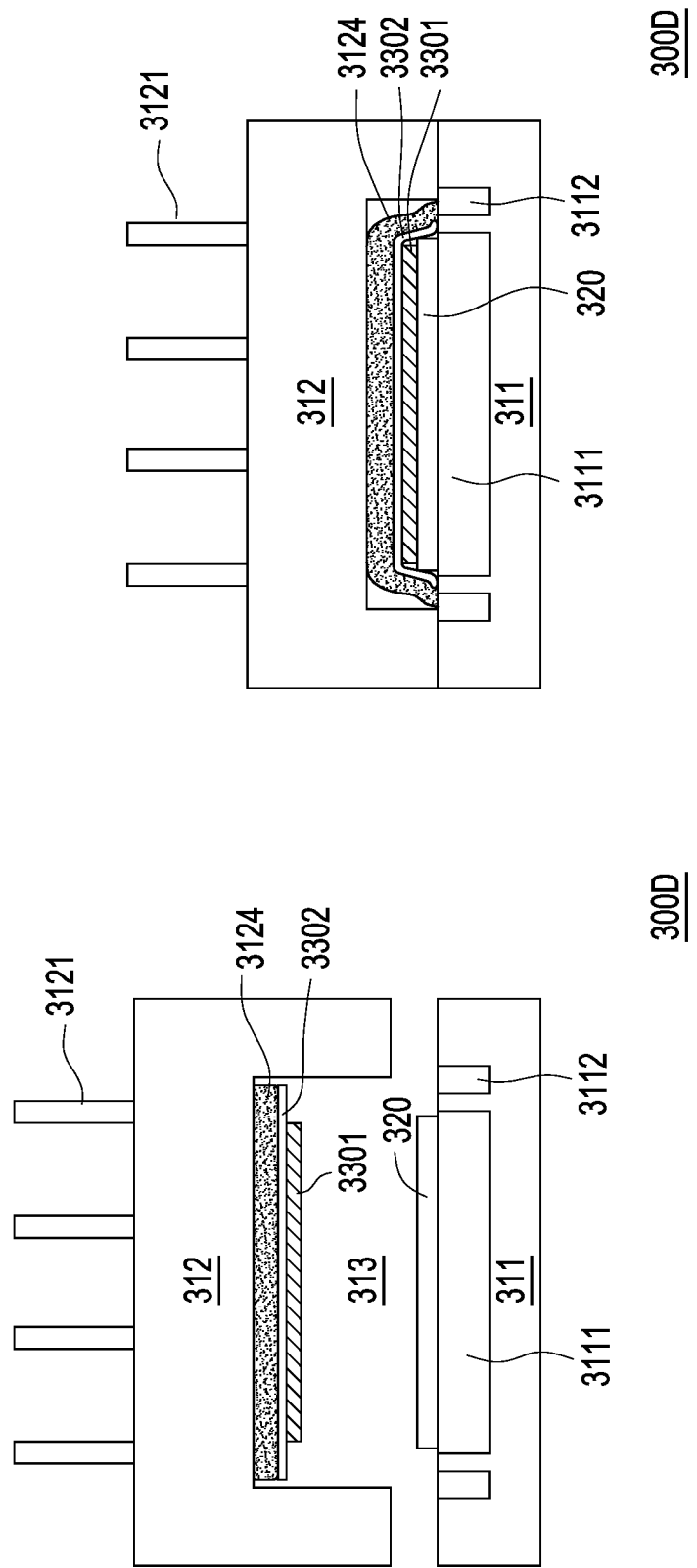

LAMINATION APPARATUS AND METHOD

BACKGROUND

In some methods for fabricating semiconductor packages, various films are laminated to semiconductor wafers for different applications. There is a need for a lamination apparatus that applies films to surfaces of the semiconductor wafers without forming air bubbles between the films and the semiconductor wafers and/or creating wrinkles in the films during the lamination process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4B are schematic cross-sectional views of a laminator during a lamination process according to some embodiments.

FIGS. 6A-6B are schematic cross-sectional views of a laminator during a lamination process according to some embodiments.

DETAILED DESCRIPTION

Figure 1A:
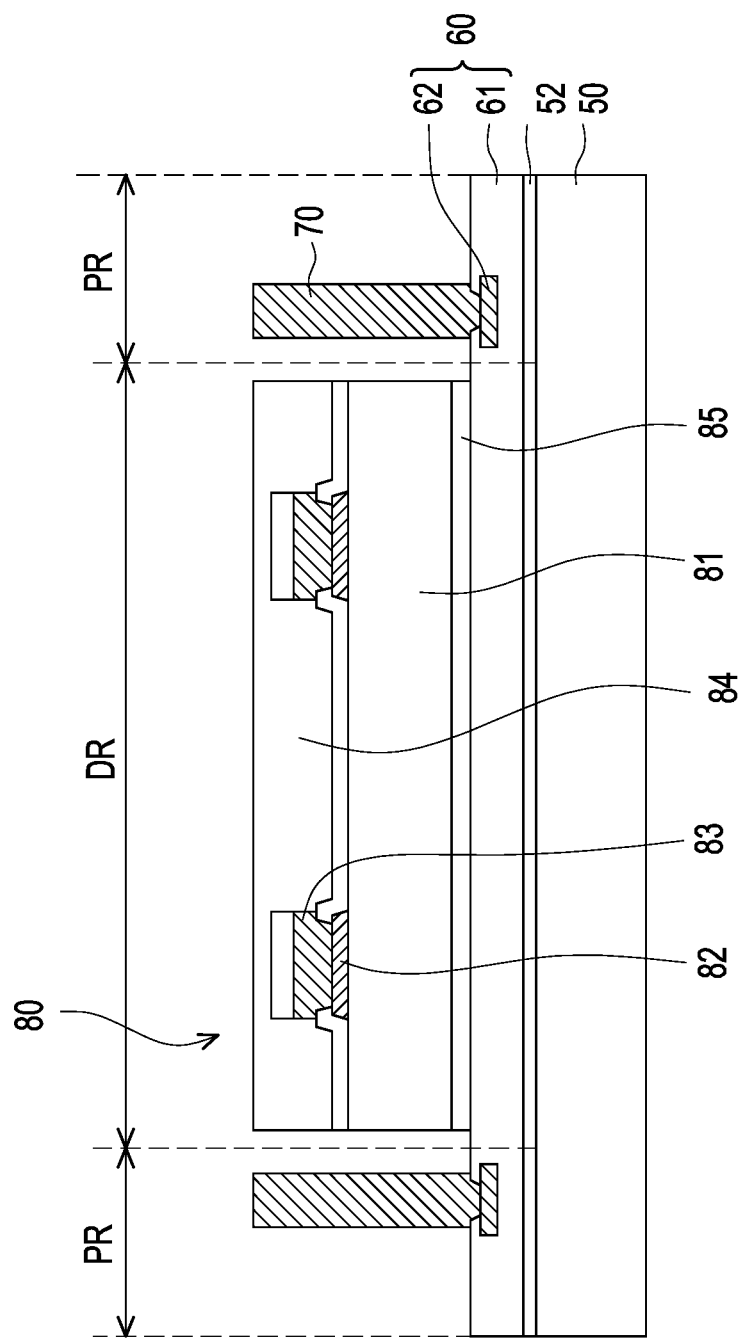
FIGS. 1A-1G are schematic cross-sectional views at various stages of formation of a package structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1G are schematic cross-sectional views at various stages of formation of a package structure 10 according to some embodiments. Referring to FIG. 1A, a temporary carrier 50 including a release layer 52 formed on a surface thereof is provided. In some embodiments, the temporary carrier 50 includes any suitable material that could provide structural support during subsequent processing. The temporary carrier 50 may include metal (e.g., steel), glass, ceramic, silicon (e.g., bulk silicon), combinations thereof, or the like. In one embodiment, the temporary carrier 50 is a semiconductor wafer. In some embodiments, the release layer 52 is formed of a polymer-based material, which can be removed along with the temporary carrier 50 from the overlying structures that will be formed in subsequent steps. For example, the release layer 52 is an epoxy-based thermal-release material, which loses its adhesive property when heated, such as a light-to-heat-conversion (LTHC) release coating. Alternatively, the release layer 52 may be an ultraviolet (UV) glue, which loses its adhesive property when exposed to UV lights.

A first redistribution structure 60 is then formed on the temporary carrier 50, and conductive connectors 70 are formed on the first redistribution structure 60. As shown in FIG. 1A, the first redistribution structure 60 includes a dielectric layer 61 and a patterned conductive layer 62 formed therein. In some embodiments, the dielectric layer 61 is formed of any suitable material, such as polybenzoxazole (PBO), polyimide (PI), benzocyclobutene (BCB), or other material that is electrically insulating. The dielectric layer 61 may be formed using any suitable method, such as a spin-on coating process, a deposition process, and the like. In some embodiments, the patterned conductive layer 62 is formed of any conductive material, such as copper, copper alloy, aluminum, aluminum alloy, combinations thereof, or other suitable conductive material. The patterned conductive layer 62 may be formed by first forming openings in the dielectric layer 61 using photolithography and etching processes, filling the openings with conductive material using any suitable process such as a sputtering process, a plating process, or the like, and then performing a planarization process such as a chemical mechanical polishing (CMP) process or an etching back process to remove excess conductive material.

Although one dielectric layer 61 and one patterned conductive layer 62 are illustrated in FIG. 1A, the number of the dielectric layer 61 and the patterned conductive layer 62 can be selected based on the demand and design requirement, and thus are not limited in the disclosure. Furthermore, the first redistribution structure 60 may be referred to as a backside redistribution structure given its placement in the structure.

In some embodiments, the dielectric layer 61 may be partially removed to form openings that expose the topmost patterned conductive layer 62. Thereafter, a conductive material is formed in the openings of the dielectric layer 61 to connect the patterned conductive layer 62 and further protrude from the dielectric layer 61, thereby forming the conductive connectors 70. In some embodiments, the conductive connectors 70 are formed by photolithography, plating, photoresist stripping processes, or any other suitable method. A material of the conductive connectors 70 may be the same or similar with that of the patterned conductive layer 62. Alternatively, the materials of the conductive connectors 70 and the patterned conductive layer 62 may be different.

Still referring to FIG. 1A, the first redistribution structure 60 includes a die attach region DR and a peripheral region PR beside the die attach region DR, in accordance with some embodiments. The conductive connectors 70 may be formed in the peripheral region PR of the first redistribution structure 60, and a semiconductor die 80 may be provided and disposed in the die attach region DR of the first redistribution structure 60. The semiconductor die 80 may be a known good die (KGD) attached to the first redistribution structure 60 using, for example, a pick and place technique, or other suitable method. In some embodiments, the semiconductor die 80 is a logic die such as a central processing unit (CPU), a graphics processing unit (GPU), a system-on-a-chip (SoC); an application-specific die, or the like. In some other embodiments, the semiconductor die 80 is a memory die such as a dynamic random access memory (DRAM) die, a static random access memory (SRAM) die, a magnetoresistive random-access memory (MRAM), a high bandwidth memory (HBM) module, or the like. The type of the semiconductor die 80 may be selected and designated based on the demand and design requirement, and thus is not specifically limited in the disclosure.

In some embodiments, the semiconductor die 80 includes a substrate 81, a plurality of conductive pads 82 formed over the substrate 81, a plurality of conductive pillars 83 respectively connected to the conductive pads 82, and a protection layer 84 covering the conductive pads 82 and the conductive pillars 83. For example, the substrate 81 is a silicon substrate including active components (e.g., diodes, transistors, or the like) and passive components (e.g., resistors, capacitors, inductors, or the like) formed therein. In one embodiment, the conductive pads 82 are made of aluminum or alloys thereof. Although not shown, the semiconductor die 80 may include an interconnection structure disposed between the substrate 81 and the conductive pads 82, where the conductive pads 82 are in physical contact with the interconnection structure.

In addition, the conductive pillars 83 are respectively disposed on the conductive pads 82, where the conductive pillars 83 are in physical contact with the conductive pads 82 and are electrically connected to the conductive pads 82. For example, the conductive pillars 83 include copper pillars, copper alloy pillars, or other suitable metal pillars. In certain embodiments, the conductive pillars 83 each includes a solder bump, which includes a lead-based material or a lead-free material, formed on the top. In some embodiments, the protection layer 84 is made of a PBO layer, a PI layer, or suitable polymers or inorganic materials to provide protection to the conductive pads 82 and the conductive pillars 83.

It should be noted that the number of the semiconductor die can be one or more than one, the disclosure is not limited thereto. In certain embodiments, additional semiconductor die(s) may be provided, and the additional semiconductor die(s) and the semiconductor die 80 may be the same type or different types. As shown in FIG. 1A, the semiconductor die 80 is attached to the first redistribution structure 60 through a die attach layer 85. In some embodiments, the die attach layer 85 functions as an adhesive mechanism to adhere the semiconductor die 80 to the first redistribution structure 60. For example, the die attach layer 85 is a die attached film (DAF), an adhesive bonding film (ABF), or the like.

Figure 1B:
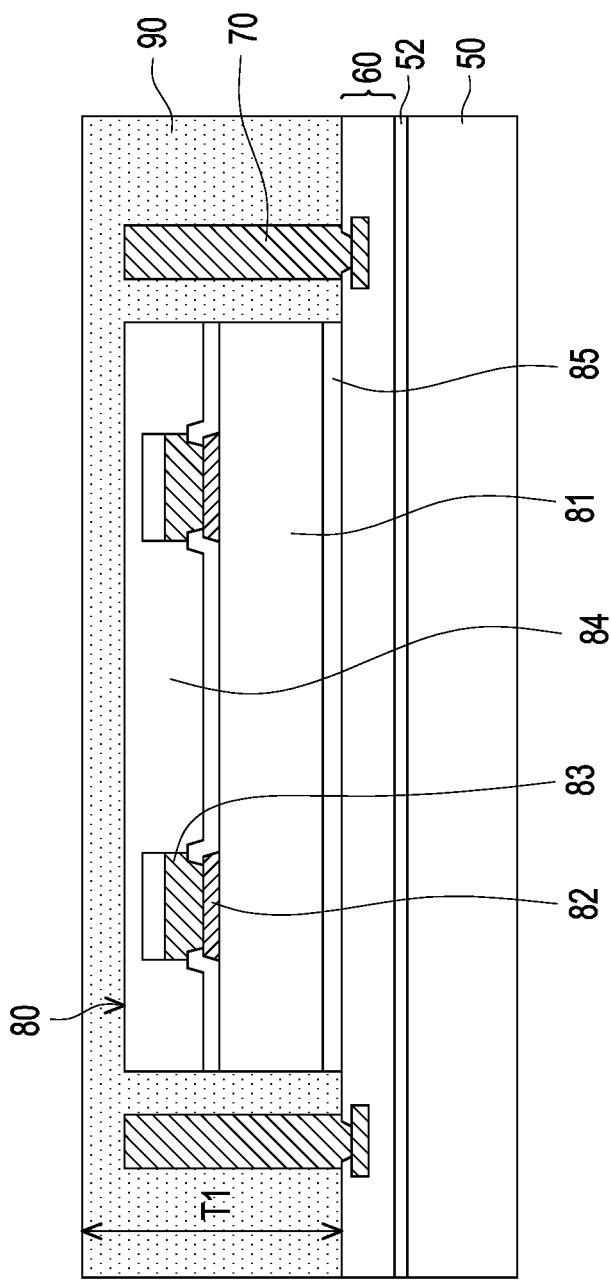

Turning to FIG. 1B, an encapsulant 90 is formed on the first redistribution structure 60 to encapsulate the conductive connectors 70, the semiconductor die 80 and the die attach layer 85. In some embodiments, the encapsulant 90 is formed of an insulating material such as a molding compound, a molding underfill, a resin (such as epoxy), or the like. For example, the encapsulant 90 may have a thickness T1 in a range of about 20 μm to about 300 μm. Further, in certain embodiments, the encapsulant 90 is a pre-formed molding film that is formed on the first redistribution structure 60 through a lamination process. The detailed description of the lamination process will be described later accompanying with FIGS. 2-7B.

Figure 1C:
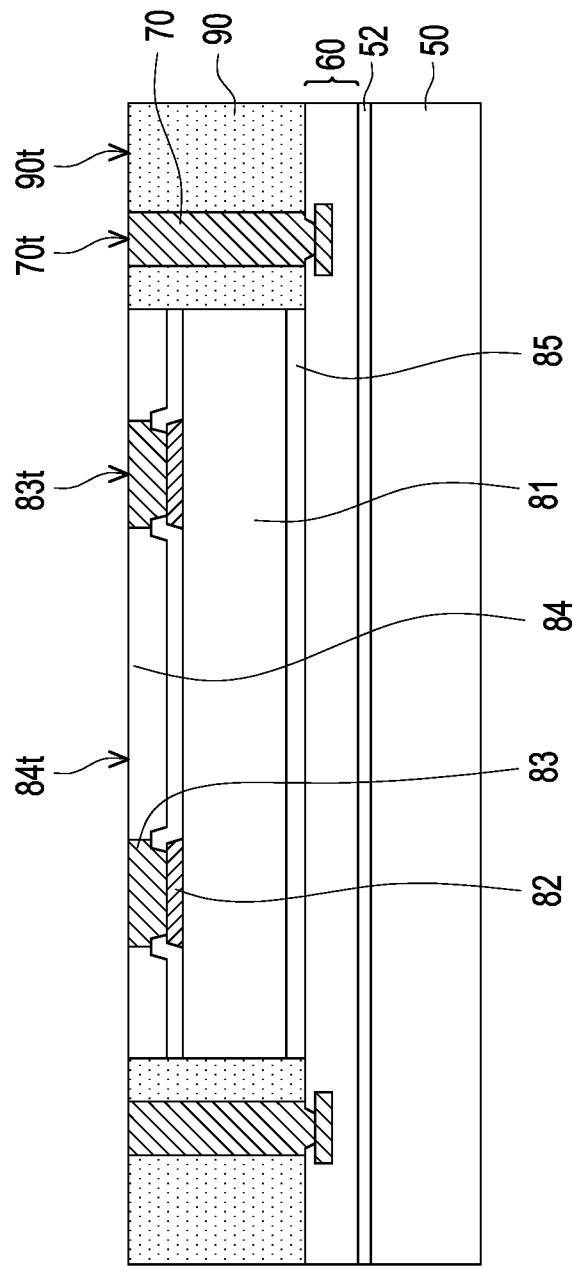

After the formation (e.g., lamination) of the encapsulant 90, a planarization process is performed to expose the conductive connectors 70 and the conductive pillars 83. For example, a planarization process such as a CMP process, a mechanical grinding process is performed to planarize the encapsulant 90, the semiconductor die 80, and the conductive connectors 70 until top surfaces of the conductive pillars 83 are exposed. During the planarization process, the protection layer 84 of the semiconductor die 80 is partially removed to expose top surfaces 83t of the conductive pillars 83, and the encapsulant 90 is partially removed to expose top surfaces 70t of the conductive connectors 70. As shown in FIG. 1C, the top surfaces 70t of the conductive connectors 70, the top surfaces 83t of the conductive pillars 83, an exposed top surface 84t of the protection layer 84, and an exposed top surface 90t of the encapsulant 90 are substantially levelled with one another. In some embodiments, the conductive connectors 70 are referred to as through vias or through molding vias (TMVs) since they penetrate through the encapsulant 90.

Figure 1D:
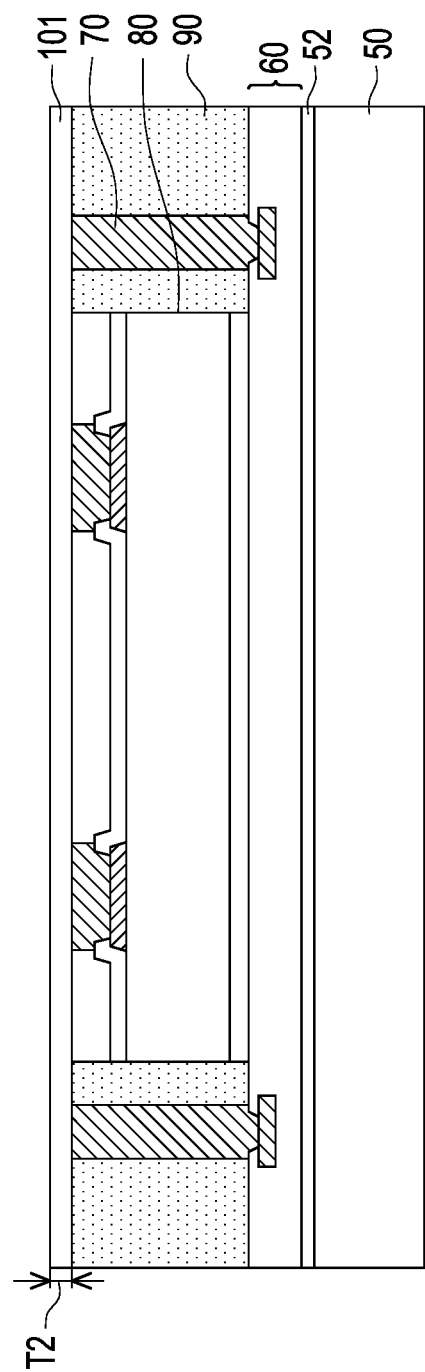

Referring to FIG. 1D, a dielectric layer 101 is disposed over the conductive connectors 70, the semiconductor die 80, and the encapsulant 90. In some embodiments, the dielectric layer 101 includes the same or similar material as that of the dielectric layer 61 of the first redistribution structure 60 and is formed by a similar process. Alternatively, the material of the dielectric layer 101 and the dielectric layer 61 may be different. In one embodiment, the dielectric layer 101 may be formed to have a thickness T2 of about 20 μm to about 100 μm. In certain embodiments, the dielectric layer 101 is formed through a lamination process. Similarly, the detailed description of the lamination process will be described later accompanying with FIGS. 2-7B.

Figure 1E:
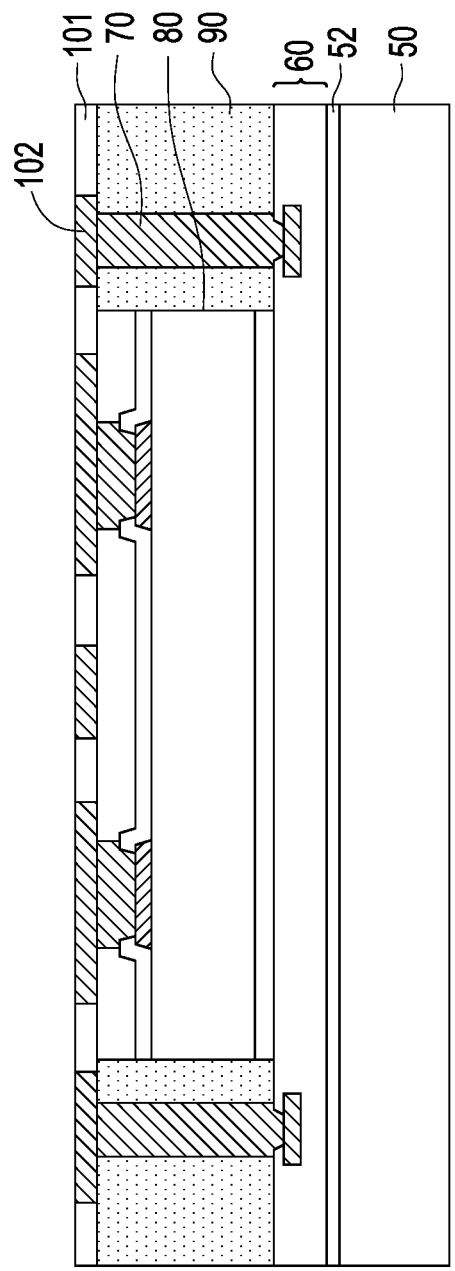

Subsequent to the formation (e.g., lamination) of the dielectric layer 101, a patterned conductive layer 102 is formed in the dielectric layer 101, as shown in FIG. 1E. For example, a photolithography process followed by an etching process are performed to form openings in the dielectric layer 101, a sputtering process and/or a plating process is performed to fill the openings with conductive material, and a planarization process is performed to remove excess conductive material, thereby forming the patterned conductive layer 102. In some embodiments, a material of the patterned conductive layer 102 is the same as or similar to that of the pattered conductive layer 62. As shown in FIG. 1E, the pattered conductive layer 102 physically contacts the conductive connectors 70 and the conductive pillars 83 of the semiconductor die 80, respectively. In other words, the patterned conductive layer 102 is electrically connected to the semiconductor die 80 through the conductive pillars 83 and electrically connected to the first redistribution structure 60 through the conductive connectors 70.

Figure 1F:
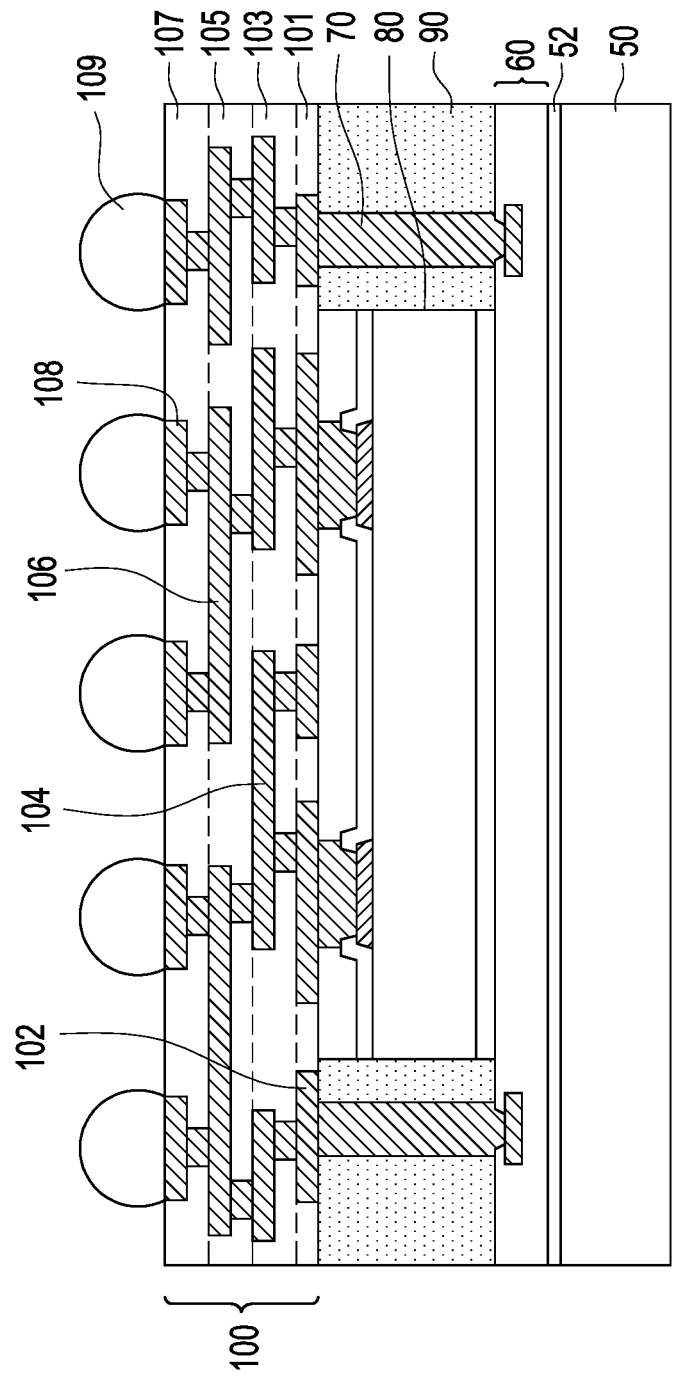

Turning to FIG. 1F, the aforementioned processes for forming the dielectric layer 101 and the patterned conductive layer 102 are sequentially repeated to form dielectric layers 103, 105, and 107 and patterned conductive layers 104, 106, and 108. As seen from FIG. 1F, the dielectric layers 101, 103, 105, and 107 are stacked in sequence, and the patterned conductive layers 102, 104, 106, and 108 are respectively formed in the corresponding dielectric layer. In some embodiments, the dielectric layers 101, 103, 105, and 107 and the patterned conductive layer 102, 104, 106, and 108 are collectively referred to as a second redistribution structure 100. The second redistribution structure 100 may also be referred to as a front-side redistribution structure. It is noted that the number of the dielectric layers and the patterned conductive layers of the second redistribution structure 100 are not limited in this disclosure.

In some other embodiments, the topmost patterned conductive layers 108 are formed in a form of pad structures for electrical connection to later-formed components. For example, the above-mentioned pads may include under-ball metallurgy (UBM) patterns for ball mount and/or connection pads for mounting of electronic components. The shape and number of the pads are not limited in this disclosure. A plurality of conductive terminals 110 is then formed over the second redistribution structure 100 for external electrical connection. In some embodiments, the conductive terminals 110 are disposed on the patterned conductive layer 108 of the second redistribution structure 100 by a ball placement process, a plating process, or other suitable processes. For example, the conductive terminals 110 include solder balls, ball grid array (BGA) balls, or other terminals. Other possible forms and shapes of the conductive terminals 110 may be utilized according to the design requirement. In some embodiments, a soldering process and a reflow process may be optionally performed for enhancement of the adhesion between the conductive terminals 110 and the second redistribution structure 100.

Figure 1G:
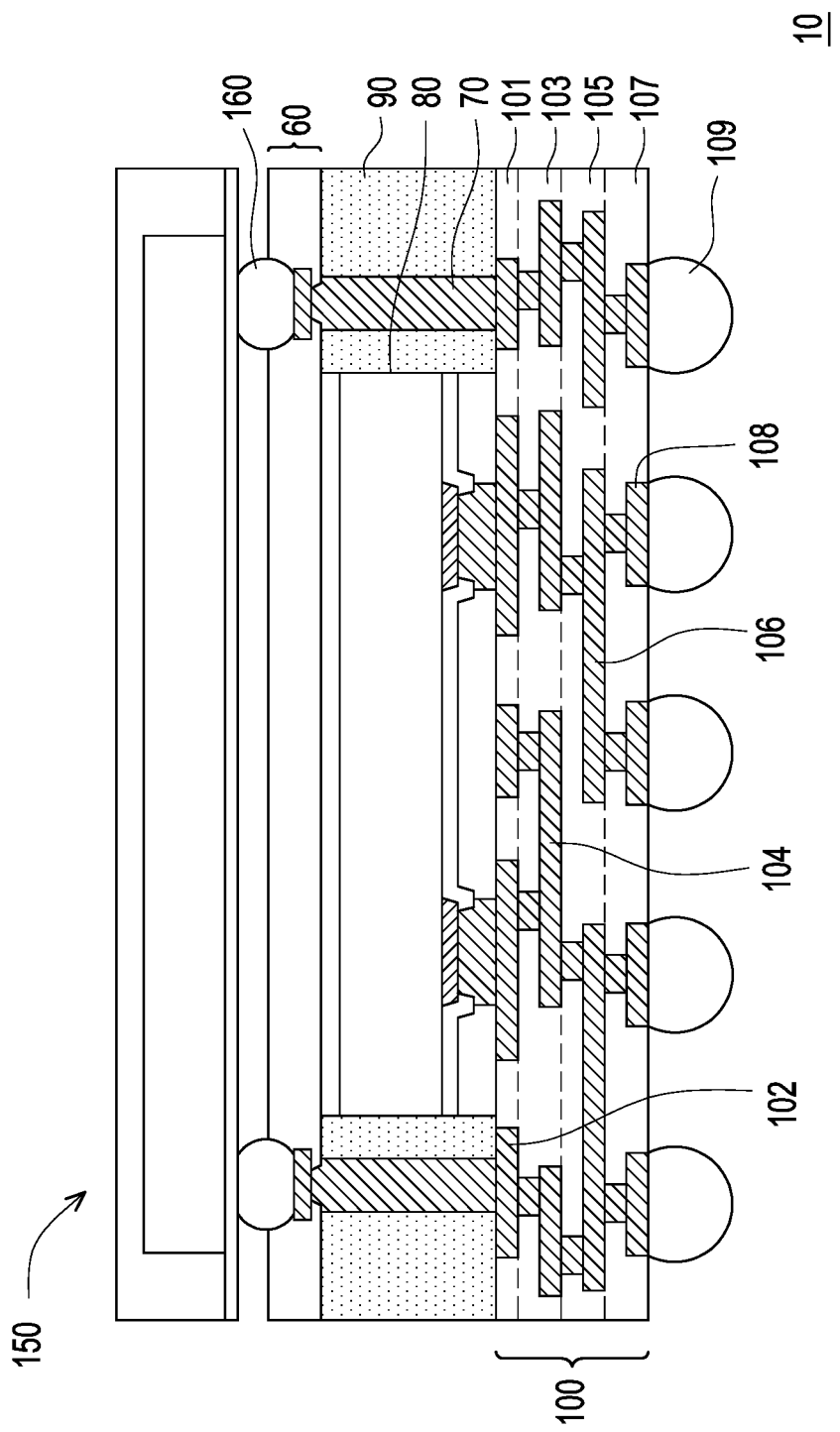

Referring to FIG. 1G, after forming the conductive terminals 110, the temporary carrier 50 and the release layer 52 are removed to expose the first redistribution structure 60. For example, the temporary carrier 50 is detached from the first redistribution structure 60 through a de-bonding process. The structure may then be flipped (e.g., turned upside down) and a semiconductor device 150 may be provided and disposed on the first redistribution structure 60. The semiconductor device 150 may include digital chips, analog chips or mixed signal chips, such as application-specific integrated circuit (ASIC) chips, sensor chips, wireless and radio frequency (RF) chips, MEMS chips, CIS chips, pre-assembled packages, memory chips, logic chips or voltage regulator chips.

In some embodiments, the semiconductor device 150 is disposed on the first redistribution structure 60 through a bonding process such as flip chip bonding. For example, solder joints (not shown) may be first formed at exposed surface of the first redistribution structure 60, and terminals (not shown) of the semiconductor device 150 are positioned to contact the solder joints. Thereafter, a subsequent bonding process may be performed to bond the solder joints and terminals of the semiconductor device 150. For example, a reflow process may be performed such that a portion of the terminals and/or the solder joints may melt during the reflow process and form solder regions 160 between the semiconductor device 150 and the first redistribution structure 100. Other suitable methods may be utilized to attach the semiconductor device 150 onto the first redistribution structure 60. In some embodiments, through the first redistribution structure 60, the conductive connectors 70 and the second redistribution structure 100, the semiconductor device 150 is electrically connected to the semiconductor die 80. Up to here, the manufacture of the package structure 10 is completed.

Figure 2:
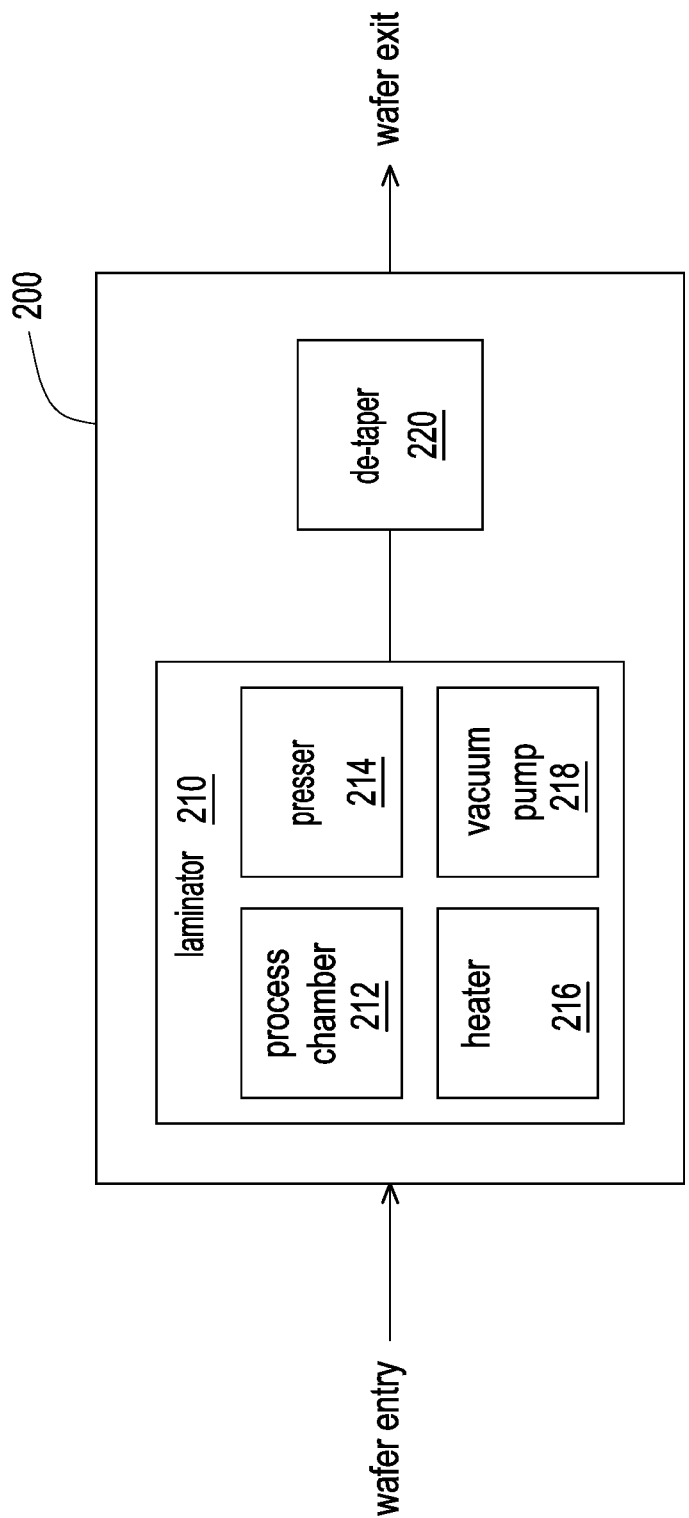
FIG. 2 is a diagram of a processing equipment for performing a lamination process according to some embodiments.

FIG. 2 is a diagram of a processing equipment 200 for performing a lamination process according to some embodiments. For example, the processing equipment 200 may be utilized in a lamination processes to form dielectric layers, molding films, or the like, such as those previously described with respect to FIG. 1B and FIG. 1E. In some embodiments, when a semiconductor wafer is processed to a stage where a lamination process needs to be performed, the semiconductor wafer is transferred to the processing equipment 200 for further processing. For example, an overhead transport (OHT) system may be used to transport a wafer carrier containing wafers to be processed to the processing equipment 200. As seen from FIG. 2, the processing equipment 200 includes a laminator 210 and a de-taper 220, in accordance with some embodiments of the disclosure. In some embodiments, wafers entering the processing equipment 200 are first passed through the laminator 210 for process film lamination, and then passed through the de-taper 220 for protection film stripping.

Still referring to FIG. 2, the laminator 210 includes a process chamber 212, a presser 214, a heater 216, and a vacuum pump 218, according to some embodiments. The process chamber 212 is where the lamination process is carried out. For example, the wafer to be processed and the film to be laminated to the wafer are moved to and placed in the process chamber 212 for further processing. In some embodiments, the presser 214 is mechanically coupled to the process chamber 212 and is configured to supply pressure to push the process film against the wafer during the lamination process. The presser 214 may be a pressing head or a pressing plate, for example. In one embodiment, a pressure applied by the presser 214 to press the process film and the wafer together is in a range of about 1 kg/cm$^2$ to about 5 kg/cm$^2$. The heater 216 is thermally coupled to the process chamber 212 and is configured to generate heat to raise and maintain a temperature of the process chamber 212 to a suitable process temperature, for example, about 100° C. to about 150° C. Additionally, the vacuum pump 218 is fluidly coupled to the process chamber 212 and is configured to create a suction force to evacuate any gases within the process chamber 212 before the process film is pressed against the wafer in order to avoid air bubbles at an interface of the wafer and the process film.

Once the wafer and the process film are placed in placed in the process chamber 212, and the process chamber 212 is heated to a predetermined temperature by the heater 216 and is vacuumed by the vacuum pump 218, the process film is pressed against the wafer by the presser 214 for about 1-2 minutes to laminate the process film to the wafer. After the lamination of the process film is done, the process chamber 212 is opened and the processed wafer is moved to the de-taper 220 to remove a cover film from the process film. In some embodiments, the cover film acts as a release film that provides protection to the underlying material film and can be detached from the process film during a de-taping process. Up to here, the lamination process is completed, and the processed wafer is removed from the processing equipment 200 to the wafer carrier for subsequent other processes.

Figure 3B:
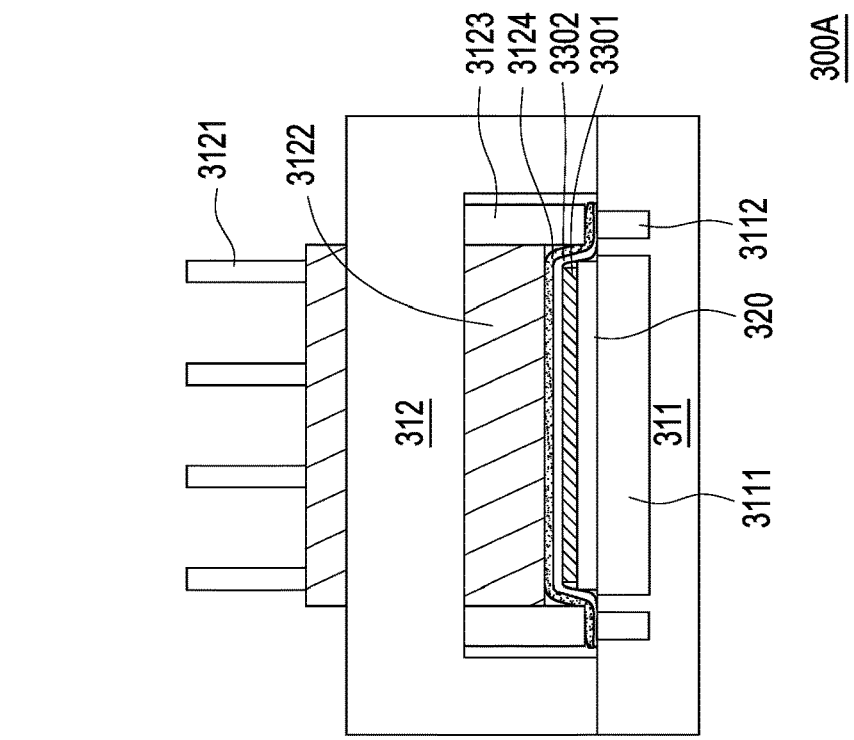
FIGS. 3A-3B are schematic cross-sectional views of a laminator during a lamination process according to some embodiments.
Figure 3A:
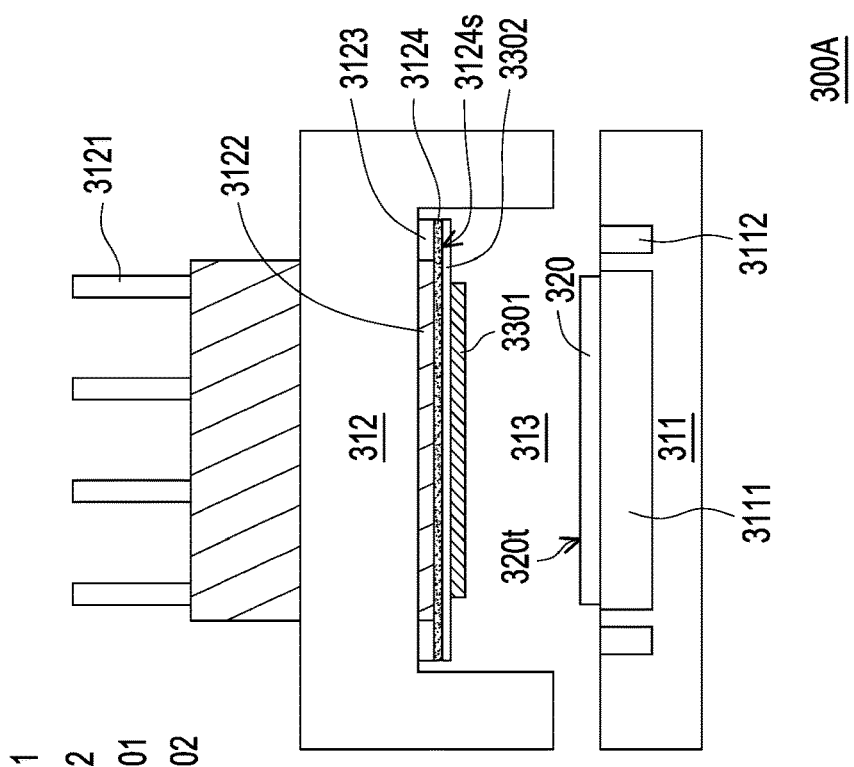
Figure 3C:
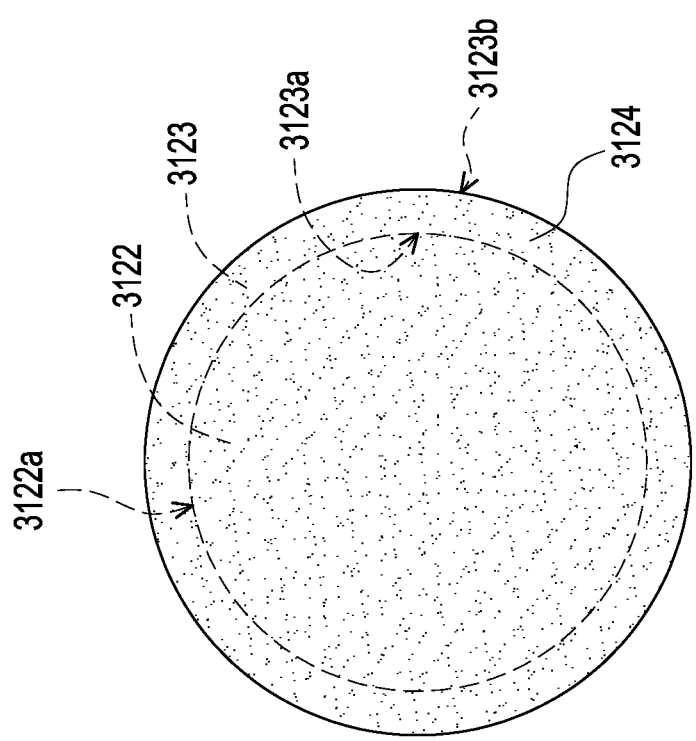
FIG. 3C is a schematic bottom-up view of a portion of the laminator shown in FIGS. 3A-3B according to some embodiments.

FIGS. 3A-3B are schematic cross-sectional views of a laminator 300A during a lamination process according to some embodiments. For example, FIG. 3A and FIG. 3B show cross-sectional views of the laminator 300A before and after the lamination process begins, respectively. FIG. 3C is a schematic bottom-up view of a portion of the laminator 300A. Referring to FIGS. 3A-3C along with FIG. 2, a laminator 300A and the operation of the laminator 300A during a lamination process will be described in greater detail below.

As illustrated in FIGS. 3A and 3B, the laminator 300A includes a process chamber 310, a semiconductor substrate 320 placed within the process chamber 310, and a process film 330 to be laminated to the semiconductor substrate 320. In some embodiments, the process chamber includes a lower chamber 311, an upper chamber 312, and an inner chamber space 313 defined by the lower chamber 311 and the upper chamber 312. In some embodiments, the semiconductor substrate 320 (e.g., a semiconductor wafer) is supported and brought into position in the lower chamber 311 by a wafer pedestal 3111. For example, the wafer pedestal 3111 is an electrostatic chuck (e-chuck). In some other embodiments, the lower chamber 311 further includes an alignment mark 3112 that helps to provide fine positioning of the semiconductor substrate 320 on the wafer pedestal 3111. For example, the semiconductor substrate 320 is guided through the use of the alignment mark 3112 to align the semiconductor substrate 320 with the wafer pedestal 3111. In certain embodiments, the wafer pedestal 3111 has a circular shape and the alignment mark 3112 encircling the wafer pedestal 3111 has an annular shape in a plan view. In one embodiment, a surface area of the semiconductor substrate 320 is slightly smaller than a surface area of the wafer pedestal 3111. In other words, sidewalls of the semiconductor substrate 320 may be laterally offset inward from sidewalls of the wafer pedestal 3111.

In some embodiments, the upper chamber 312 is located directly above the lower chamber 311. That is, sidewalls of the upper chamber 312 may be vertically aligned with sidewalls of the lower chamber 311, so that the upper chamber 312 can be aligned and clamped with the lower chamber 311 to securely close the process chamber 310. As shown in FIGS. 3A and 3B, the upper chamber 312 includes a plurality of connecting rods 3121, a metal plate 3122 connected to the plurality of connecting rods 3121, a vertically-moving jig 3123 connected to the upper chamber 312 and a silicone rubber 3124 in contact with the metal plate 3122 and the vertically-moving jig 3123. In addition, although not explicitly illustrated, a heater (e.g., heater 216 in FIG. 2) and a vacuum pump (e.g., vacuum pump 218 in FIG. 2) are embedded in the upper chamber 312 and are configured to generate a high temperature and a low degree of vacuum within the inner chamber space 313, respectively. For example, the heater and the vacuum pump may be installed at an inner top surface of the upper chamber 312.

As mentioned above, in the lamination process, after the semiconductor substrate 320 is positioned over the wafer pedestal 3111, the process chamber 310 is closed and a lower vacuum state is achieved in the inner chamber space 313, and then the metal plate 3122 and the vertically-moving jig 3123 are mechanically actuated (through the connecting rods 3121) to bring the underlying the silicone rubber 3124 and the process film 330 into contact with a top surface 320t (e.g., an active surface) of the semiconductor substrate 320.

In some embodiments, the connecting rods 3121 include pneumatic-driven rods, hydraulic-driven rods, electromechanical-driven rods, or the like, and is connected to a pressor (not shown) to actuate the connecting rods 3121 by pressure from the presser. Although four connecting rods are illustrated in FIGS. 3A and 3B, it is understood that any number of the connecting rods can be utilized depending on the tool design. In embodiments where four connecting rods are used, the connecting rods are evenly arranged at four corners of the metal plate 3122.

In some embodiments, the metal plate 3122 including a metallic material is used to facilitate heat transfer (for example, transferring the heat generated from the heater (not shown)) to maintain a high process temperature within the process chamber 310 as the temperature of the inner chamber space 313 may drop due to the opening/closing of the process chamber 310. In some embodiments, the metal plate 3122 includes a diameter in a range of about 298 mm to about 300 mm and a thickness in a range of about 25 mm to about 30 mm.

Furthermore, as seen from FIGS. 3A-3C, the vertically-moving jig 3123 is located beside the metal plate 3122 and surrounds the metal plate 3122. In other words, the vertically-moving jig 3123 and the metal plate 3122 are in physical contact with each other. In some embodiments, from a plan view, the metal plate 3122 has a circular shape and the vertically-moving jig 3123 has an annular shape, as illustrated in FIG. 3C. For example, a periphery 3122a of the metal plate 3122 and an inner periphery 3123a of the vertically-moving jig 3123 coincide with each other. In some embodiments, the vertically-moving jig 3123 is used to fix the silicone rubber 3124 in an area defined by the lower chamber 311, the metal plate 3122, and the vertically-moving jig 3123 during the pressing of the lamination process, thereby ensuring a close contact between the process film 330 and the semiconductor substrate 320. In such embodiments, the vertically-moving jig 3123 may be referred to as a fixing ring.

Still referring to FIGS. 3A-3C, in some embodiments, the silicone rubber 3124 is attached to surfaces of the metal plate 3122 and the vertically-moving jig 3123 toward the lower chamber 311. For example, as shown in FIG. 3, the silicone rubber 3124 entirely covers the metal plate 3122 and the vertically-moving jig 3123. In one embodiment, a surface area of the silicone rubber 3124 is substantially the same as a total surface area of the metal plate 3122 and the vertically-moving jig 3123. In other words, an edge of silicone rubber 3124 may coincide with an outer periphery 3123b of the vertically-moving jig 3123. For example, the silicone rubber 3124 includes a diameter of about 350 mm. The silicone rubber 3124 may include an anti-electrostatic-type rubber, a room-temperature-vulcanizing (RTV) rubber, a fluororubber, or the like. In some embodiments, the silicone rubber 3124 includes a flat surface 3124s having a high degree of smoothness, so that the process film 330 can be well stuck to the silicone rubber 3124 and separated from the semiconductor substrate 320. That is, the surface 3124s of the silicone rubber 3124 exhibits a smooth surface texture. For example, the silicone rubber 3124 has a low surface roughness in a range of about 1 μm to about 10 μm. Additionally, the silicone rubber 3124 may have a thickness of about 0.1 mm to about 5 mm and a hardness value of about 10° to about 70°. In certain embodiment, a silicone rubber having a thickness of about 2 mm to about 3 mm is used. In some other embodiments, a uniformity of the pressure distribution across the semiconductor substrate during lamination can be increased by adjusting the thickness of the silicone rubber 3124. For example, using a thicker silicone rubber 3124 can increase the uniformity of the pressure distribution.

In some embodiments, the process film 330 includes a material film 3301 and a cover film 3302 on top of the material film 3301. The material film 3301 may be a dielectric film and a molding film as described above with respect to FIG. 1B and FIG. 1E, the like, or any film that needs to be laminated on the semiconductor substrate 320. In some embodiments, the cover film 3302 is a film that includes flat and glossy surfaces for better surface adhesion to the silicone rubber 3124. In one embodiment, the cover film 3302 is a polyethylene terephthalate (PET) film. As shown in FIGS. 3A and 3B, the cover film 3302 fully covers the material film 3301 to provide a greater protection to the material film 3301. That is, a surface area of the cover film 3302 is larger than that of the material film 3301, and may be substantially the same as the surface area of the silicone rubber 3124.

See FIGS. 3A and 3B, sidewalls of the material film 3301 are laterally offset inward from sidewalls of the semiconductor substrate 320 so that material of the material film 3301 is not squeezed out from an edge of the semiconductor substrate 320 during the lamination. The sidewalls of the material film 3301 may be still laterally offset inward from sidewalls of the semiconductor substrate 320 after the lamination process is completed. In other words, a surface area of the material film 3301 is slightly smaller than that of the semiconductor substrate 320. As illustrated in FIG. 3B, the cover film 3302 and the silicone rubber 3124 subjected to the pressure may have contours along the shapes of the material film 3301 and the semiconductor substrate 320.

With the presence of the silicone rubber 3124, the process film 330 can be initially picked up and stuck with the silicone rubber 3124 as the semiconductor substrate 320 enters the process chamber 310 under standard atmosphere pressure, so that the process film 330 is separated from the semiconductor substrate 320 before the lamination process begins. Afterwards, the process chamber 310 is closed and pumped down to a certain degree of vacuum, and the process film 330 adhered to the silicone rubber 3124 is pressed to contact the top surface 320t of the semiconductor substrate 320 by actuating (e.g., by the pressor) the connecting rods 3121 and the vertically-moving jig 3123. In addition, air may be pumped into the process chamber to assist in pressing the process film 330 onto the semiconductor substrate 320. For example, the air can be introduced into the inner chamber space 313 by an air pump (not shown) embedded in the upper chamber 312. In this way, the process film 330 is closely attached to the semiconductor substrate 320, and the semiconductor substrate 320 is subsequently transferred to a de-taper to remove the cover film 3302 of the process film 330, thereby obtaining the semiconductor substrate 320 with the material film 3301 laminated on its top.

By adopting the above method to carry out a lamination process, air bubbles can be avoided at a contact interface between the process film and the semiconductor substrate and the wrinkles generated at high process temperatures can be diminished, thereby improving process quality. For example, before lamination, the process film (i.e., its material film) is separated from the semiconductor substrate using a silicone rubber with a smooth surface, and the process film comes into contact with the semiconductor substrate only after the process chamber reaches a certain degree of vacuum. The process film can be uniformly pressed onto the semiconductor substrate by adjusting the thickness of the silicone rubber. In addition, the silicone rubber can be reused about thousands of times, which can further reduce process costs.

Figure 4C:
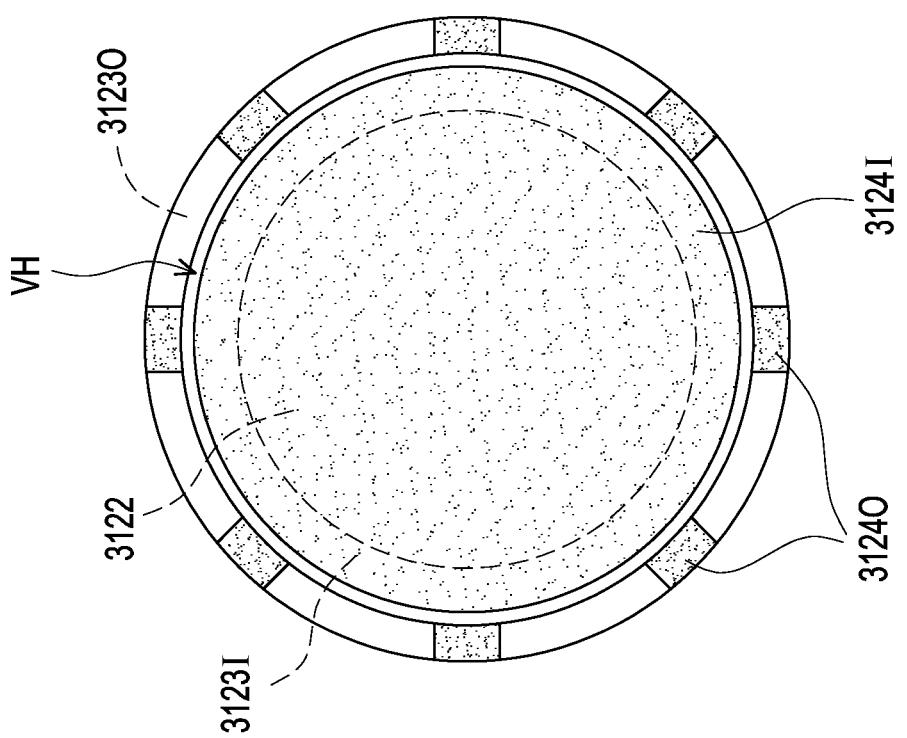
FIG. 4C is a schematic bottom-up view of a portion of the laminator shown in FIGS. 4A-4B according to some embodiments.

FIGS. 4A-4B are schematic cross-sectional views of a laminator 300B during a lamination process according to some embodiments. FIG. 4C is a schematic bottom-up view of a portion of the laminator 300B. The laminator 300B depicted in FIGS. 4A-4C and the laminator 300A depicted in FIGS. 3A-3C are similar, such that the elements similar to or substantially the same as the elements described above will use the same reference numbers, and certain details or descriptions of the same elements and the relationship thereof will not be repeated herein.

Referring to FIGS. 4A-4C, a vertically-moving jig 3123' including an inner jig 3123I and an outer jig 3123O is used. The inner jig 3123I may contact and surround the metal plate 3122, and the outer jig 3123O may further encircle the inner jig 3123I and the metal plate 3122. In some embodiments, the outer jig 3123O may be spaced apart from the inner jig 3122I by a vacuum hole VH. For example, from a plan view, the metal plate 3122 has a circular shape and the inner jig 3123I and the outer jig 3123O have annular shapes. As seen from FIG. 4C, the vacuum hole VH is in a form of a ring-shaped hole that separates the inner jig 3123I and the outer jig 3123O. During the lamination process, the metal plate 3122, the inner jig 3123I, and the outer jig 3123O may be concurrently actuated to bring the process film 330 into contact with the semiconductor substrate 320, as shown in FIG. 4B.

Furthermore, surfaces of the metal plate 3122 and the inner jig 3123I toward the lower chamber 311 are covered by a main silicone rubber portion 3124I, and a surface of the outer jig 3123O toward the lower chamber 311 is partially covered by a plurality of silicone rubber segments 3124O, in accordance with some embodiments. The main silicone rubber portion 3124I and the silicone rubber segments 3124O may collectively refer to as the silicone rubber 3124'. As illustrated in FIG. 4C, the silicone rubber segments 3124O may have an arced strip shape. In some embodiments the silicone rubber segments 3124O functions to provide additional adhesion between the silicone rubber 3124' and the cover film 3302 of the process film 330. The vacuum hole VH may be used to apply a vacuum suction to further secure the process film 330 to the silicone rubber 3124', especially at edges of the process film 330.

Figure 5B:
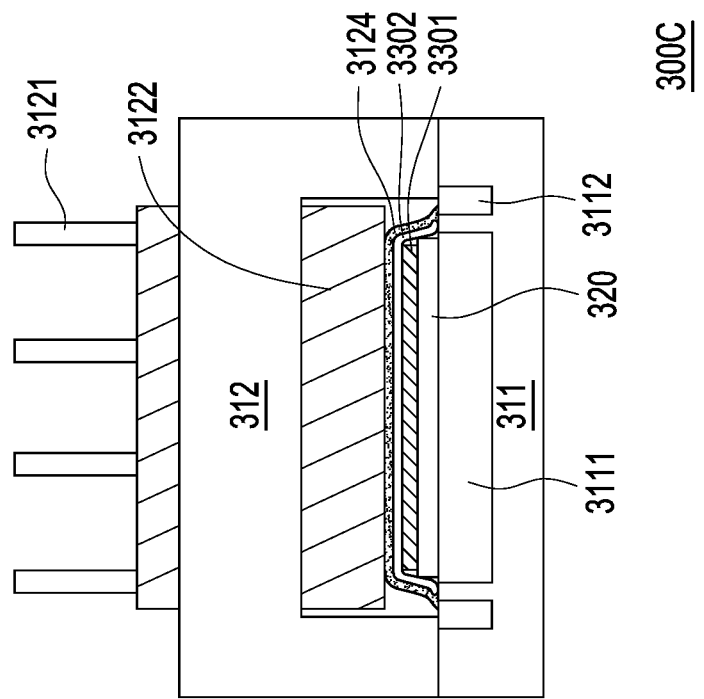
FIGS. 5A-5B are schematic cross-sectional views of a laminator during a lamination process according to some embodiments.
Figure 5A:
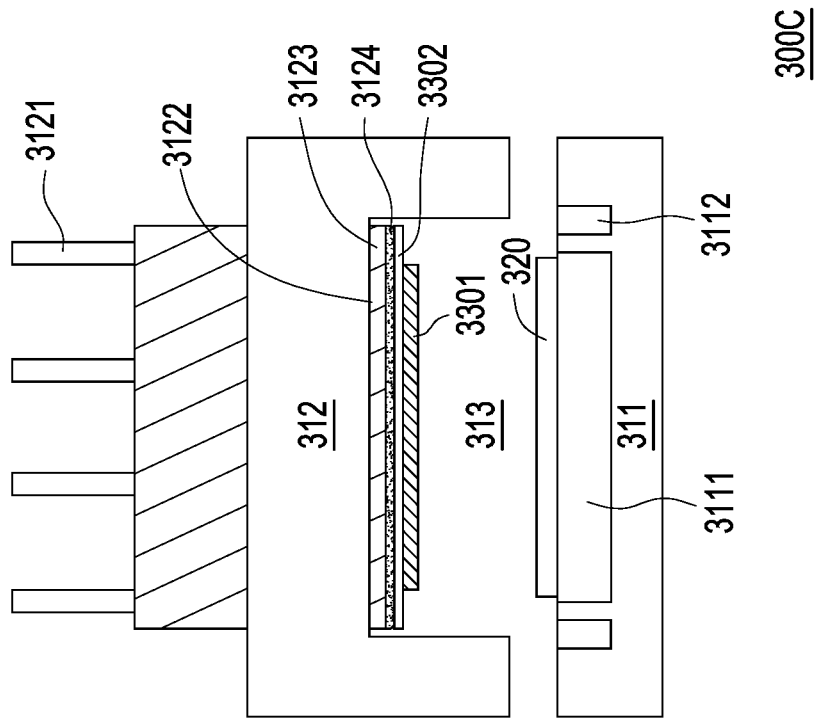

FIGS. 5A-5B are schematic cross-sectional views of a laminator 300C during a lamination process according to some embodiments. The laminator 300C depicted in FIGS. 5A-5B and the laminator 300A depicted in FIGS. 3A-3B are similar, such that the elements similar to or substantially the same as the elements described above will use the same reference numbers, and certain details or descriptions of the same elements and the relationship thereof will not be repeated herein.

Referring to FIGS. 5A-5B, the jig is not used in the laminator 300C, so the silicone rubber 3124 attached to the metal plate 3122 may have a surface area substantially the same as that of the metal plate 3122. In some embodiments, the silicone rubber 3124 and the process film 330 are pressed against the semiconductor substrate 320 by moving the metal plate 3122 downward under the actuation of the connecting rods 3121.

FIGS. 6A-6B are schematic cross-sectional views of a laminator 300D during a lamination process according to some embodiments. The laminator 300D depicted in FIGS. 6A-6B and the laminator 300C depicted in FIGS. 5A-5B are similar, such that the elements similar to or substantially the same as the elements described above will use the same reference numbers, and certain details or descriptions of the same elements and the relationship thereof will not be repeated herein.

Referring to FIGS. 5A-5B and FIGS. 6A-6B, the laminator 300D further does not use the metal plate, so that the silicone rubber 3124 may be directly connected to the connecting rods 3121. In this way, the silicone rubber 3124 and the underlying process film 330 are pressed against the semiconductor substrate 320 using the pressure provided by the connecting rods during the lamination process, according to some embodiments. Additionally, in such embodiments, a thicker silicone rubber 3124 is suitable for applying uniform pressure on the process film 330 during the lamination process to increase the process quality. If the process film 330 is not uniformly pressed, the laminated process film 330 may exhibit a difference in thickness between the center and the edge of the process film 330. For example, the thickness at the edge of the process film may be no more than 50% thinner than the thickness at the center of the process film.

Figure 7A:
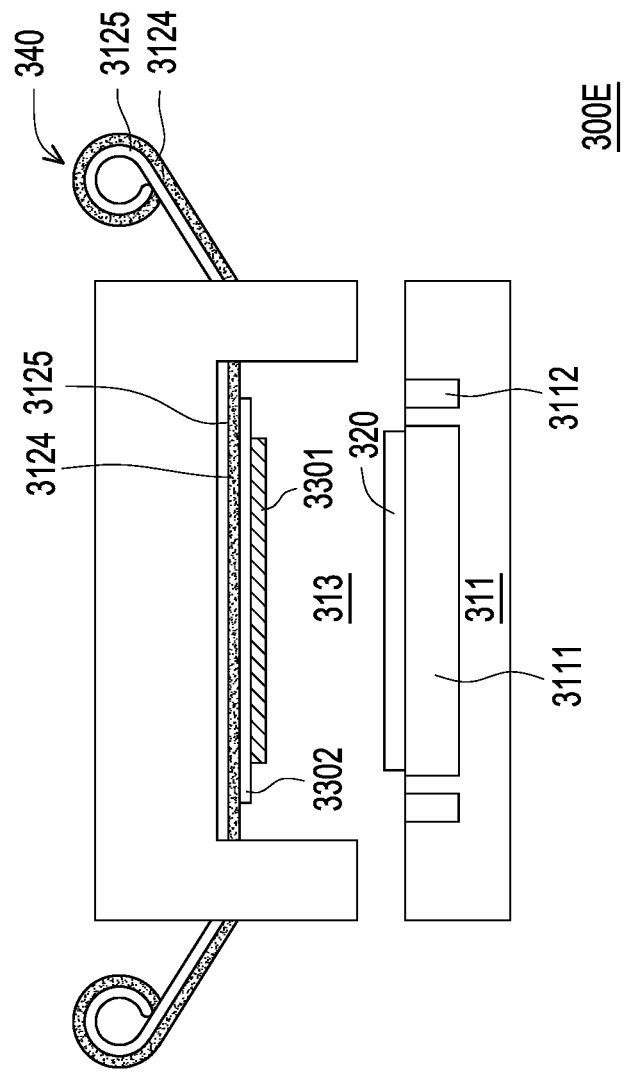
FIGS. 7A-7B are schematic cross-sectional views of a laminator during a lamination process according to some embodiments.
Figure 7B:
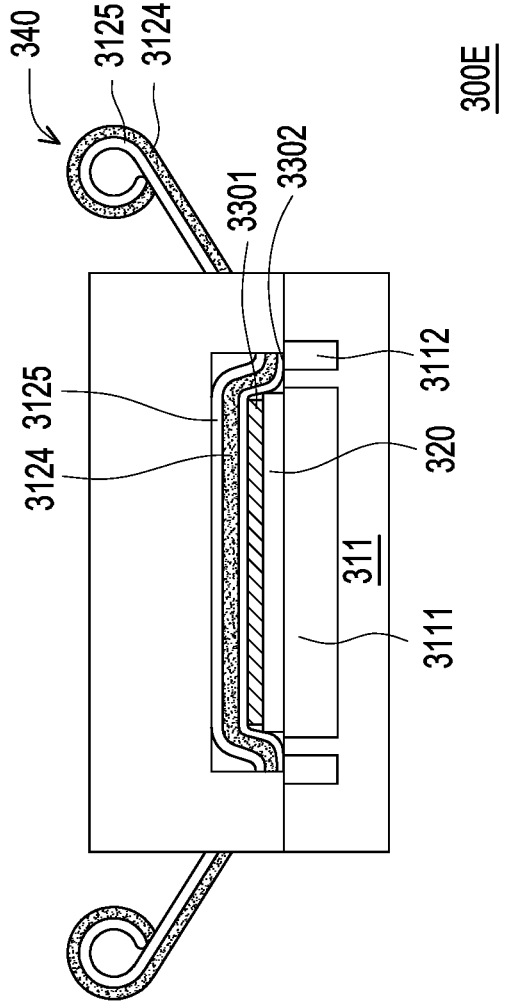

FIGS. 7A-7B are schematic cross-sectional views of a laminator 300E during a lamination process according to some embodiments. The laminator 300B depicted in FIGS. 7A-7B and the laminator 300A depicted in FIGS. 3A-3B are similar, such that the elements similar to or substantially the same as the elements described above will use the same reference numbers, and certain details or descriptions of the same elements and the relationship thereof will not be repeated herein.

Referring to FIGS. 7A-7B, a roller 340 is used in the lamination process, instead of using the connecting rods, the metal plate, and the jig. In embodiments where the roller 340 is used, a plastic cover 3125, such as a PET film, is covered a surface of the silicone rubber 3124 opposite to the surface that is in contact with the cover film 3302 of the process film 330. In some embodiments, the process film 330 is adhered to the silicone rubber 3124, and the silicone rubber 3124 and the plastic cover 3125 are collectively used to roll and release the cover film to laminate on the semiconductor substrate 320. In such embodiment, the silicone rubber 3124 and the plastic cover 3125 are used once and not reused.

In accordance with an embodiment of the disclosure, a method for laminating a film to a wafer is disclosed. The method includes at least the following steps. The wafer and the film are provided in a process chamber, and the wafer and the film are separated from each other. A vacuum state and a process temperature are achieved in the process chamber. The film is then laminated to contact a surface of the wafer.

In accordance with another embodiment of the disclosure, a method for performing a lamination process is disclosed. The method includes at least the following steps. A substrate is positioned at a first side of a chamber and a process film is positioned at a second side of the chamber opposite to the first side, and the process film is positioned through a surface adhesion between the process film and a silicone rubber located at the second side of the chamber. An enclosed space in the chamber that is heated and vacuumed is obtained. A pressure is then applied to the silicone rubber and the process film to press the process film against the substrate.

In accordance with yet another embodiment of the disclosure, an apparatus for performing a lamination process is disclosed. The apparatus includes a process chamber comprising an upper chamber, a lower chamber, and an inner space between the upper chamber and the lower chamber. The lower chamber is operable to support a substrate and the upper chamber is operable to carry a process film to be laminated on the substrate. The apparatus further includes a silicone rubber configured to the upper chamber of the process chamber, and the process film is adhered to a flat and smooth surface of the silicone rubber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for laminating a film to a wafer, comprising:
    providing the wafer at a first side of a process chamber and the film at a second side of the chamber, the wafer and the film being separated from each other, wherein a plate and a jig around the plate are positioned at the second side of the chamber, and the film is positioned below the jig and the plate;
    achieving a vacuum state and a process temperature in the process chamber; and
    by moving the plate and the jig toward the first side, laminating the film to a surface of the wafer.

2. The method of claim 1, wherein a contact interface between the film and the wafer is bubble-free.

3. The method of claim 1, wherein the film is free from generating wrinkles after being laminated to the wafer.

4. The method of claim 1, wherein the film includes a dielectric material or a molding material.

5. The method of claim 1, wherein the process temperature is in a range of about 100° C. to about 150° C., wherein the distance the jig moves toward the first side is greater than the distance the plate moves toward the first side.

6. A method for performing a lamination process, comprising:
    positioning a substrate at a first side of a chamber and positioning a process film at a second side of the chamber opposite to the first side, wherein the process film is positioned through a surface adhesion between the process film and a silicone rubber located at the second side of the chamber;
    obtaining an enclosed space in the chamber that is heated and vacuumed; and
    applying a pressure to the silicone rubber and the process film to press the process film against the substrate, wherein applying the pressure to the silicone rubber and the process film includes actuating connecting rods located at the second side of the chamber to push down the process film.

7. The method of claim 6, wherein a surface of the silicone rubber in contact with the process film has a surface roughness in a range of about 1 μm to about 10 μm.

8. The method of claim 6, wherein the silicone rubber includes an anti-electrostatic-type rubber, a room-temperature-vulcanizing rubber, or a fluororubber.

9. The method of claim 6, wherein the silicone rubber has a thickness of about 0.1 mm to about 5 mm.

10. The method of claim 6, wherein sidewalls of the process film are laterally offset inward from sidewalls of the substrate after the lamination process.

11. The method of claim 6, wherein the connecting rods include pneumatic-driven rods, hydraulic-driven rods, or electromechanical-driven rods.

12. The method of claim 6, further comprising pumping an air into the enclosed space of the chamber after the process film is pressed against the substrate.

13. A method for performing a lamination process, comprising:
    providing a process chamber comprising an upper chamber, a lower chamber, and an inner space between the upper chamber and the lower chamber, the lower chamber operable to support a substrate and the upper chamber operable to carry a process film to be laminated on the substrate, wherein a silicone rubber is configured to the upper chamber of the process chamber, and the process film is adhered to a flat and smooth surface of the silicone rubber, wherein the silicone rubber includes an anti-electrostatic-type rubber, a room-temperature-vulcanizing rubber, or a fluororubber; and
    pressing the process film against the substrate.

14. The method of claim 13, wherein the process film comprises a material film and a cover film on top of the material film, and the cover film is between the silicone rubber and the material film when the process film is carried by the upper chamber.

15. The method of claim 13, wherein the process film is pressed against the substrate by a presser mechanical coupled to the process chamber.

16. The method of claim 15, further comprising:
    raising a temperature of the inner space of the process chamber by a heater thermally coupled to the process chamber.

17. The method of claim 16, further comprising:
    generating a vacuum state within the inner space of the process chamber by a vacuum pump fluidly coupled to the process chamber.

18. The method of claim 17, wherein the lower chamber comprises a substrate pedestal to support the substrate, and a surface area of the substrate is smaller than that of the substrate pedestal.

19. The method of claim 13, wherein the upper chamber comprises a jig in contact with the silicone rubber, and the jig is vertically moved in the process chamber during the lamination process.

20. The method of claim 19, wherein the upper chamber further comprises a metal plate in contact with the silicone rubber and surrounded by the jig, and in a plan view, the metal plate has a circular shape and the jig has a ring shape.

\* \* \* \* \*